Figure 1:
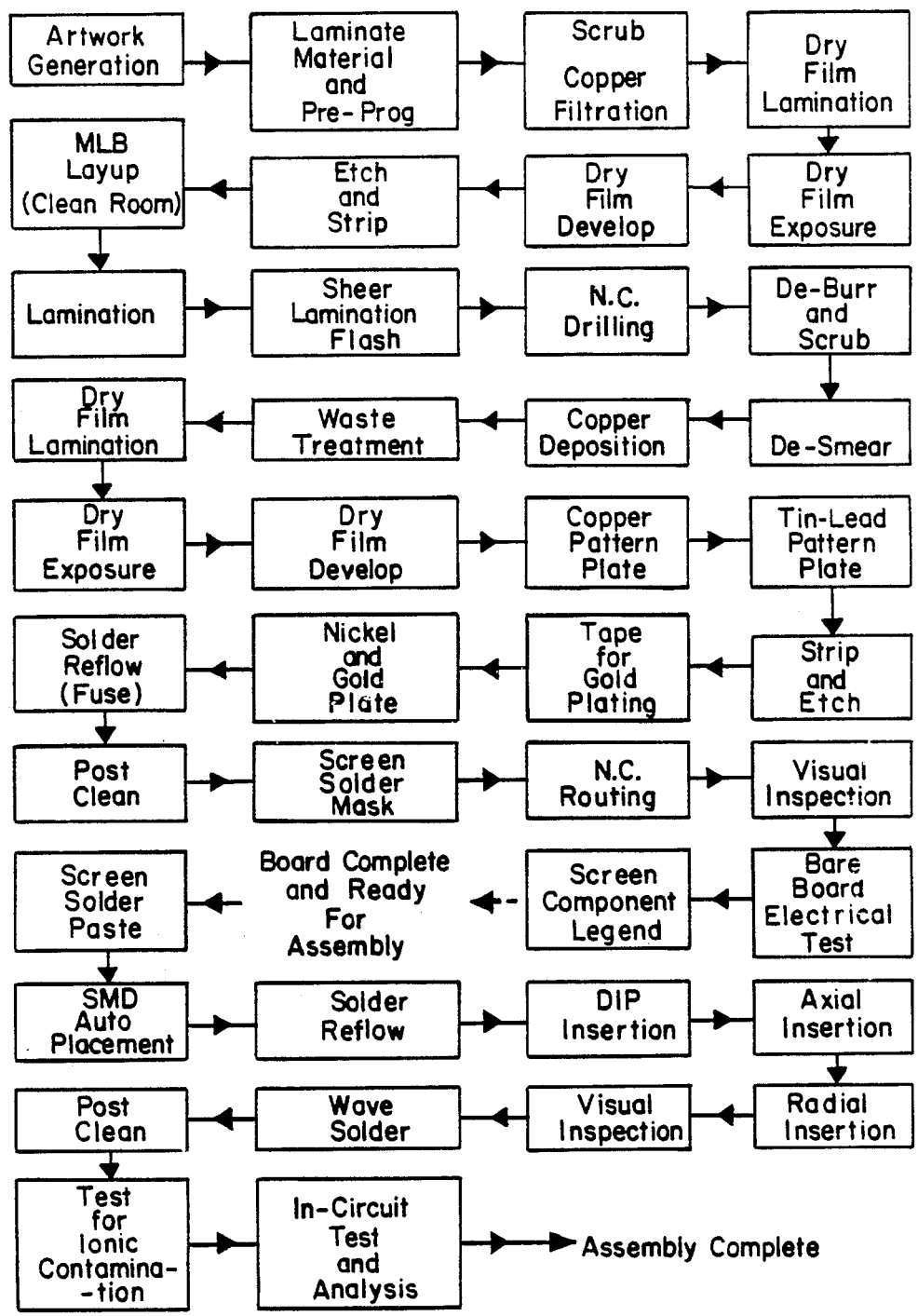

United States Patent [19]

Futch et al.

[11] Patent Number: 4,934,391

[45] Date of Patent: Jun. 19, 1990

[54] DIBASIC ESTERS FOR CLEANING ELECTRONIC CIRCUITS

[75] Inventors: Larry Futch, Yulee; Kevin R. Hrebenar, Jacksonville; Michael E. Hayes, Hayes, all of Fla.

[73] Assignee: 501 Petroleum Fermentations N.V., Curacao, Netherlands

[21] Appl. No.: 305,897

[22] Filed: Feb. 2, 1989

Related U.S. Application Data

[63] Continuation-in-part of Ser. No. 153,637, Feb. 8, 1988, abandoned.

[51] Int. Cl.$^5$ .............................................. B08B 3/08
[52] U.S. Cl. ........................................ 134/40; 134/2; 252/174.19; 252/174.21
[58] Field of Search .................. 134/40, 2; 252/174.19, 252/174.21

[56] References Cited

U.S. PATENT DOCUMENTS 4,780,235 10/1988 Jackson ..................... 252/DIG. 8
4,781,916 11/1988 Papaphilippore ..................... 424/61

FOREIGN PATENT DOCUMENTS 5157700 5/1979 Japan ............................. 252/174.19

*Primary Examiner*—Asok Pal
*Attorney, Agent, or Firm*—Pennie & Edmonds

[57] ABSTRACT

Methods and compositions are provided for the removal of soldering flux, screen inks and resists from contaminated surfaces. The compositions of the invention contain dibasic acid esters in combination with an appropriate emulsifying surfactant.

31 Claims, 1 Drawing Sheet

DIBASIC ESTERS FOR CLEANING ELECTRONIC CIRCUITS

This application is a continuation-in-part of copending U.S. application Ser. No. 153,637, filed on Feb. 8, 1988, now abandoned.

TABLE OF CONTENTS

1. Field of the Invention
2. Background of the Invention
3. Summary of the Invention
4. Brief Description of the Figure
5. Detailed Description of the Invention
5.1. Rosin Flux Cleaning and Residue Removal
5.2. Screen Ink Cleaning and Residue Removal
6. Examples
6.1. Rosin Flux Cleaning
6.2. Screen Ink Cleaning

1. FIELD OF THE INVENTION

The present invention relates to non-toxic, environmentally safe compositions for use in removing organic residues from contaminated surfaces. Dibasic ester compounds are utilized with or without dibasic ester emulsifying surfactants to achieve a variety of objectives, among which are the removal of solder flux, oils, waxes and greasy substances from metal surfaces, as well as removing uncured inks and resists from printing screens and stencils.

2. BACKGROUND OF THE INVENTION

The use of fluxes, particularly rosin fluxes, is a virtually inescapable aspect of processes requiring soldering, i.e., the making of mechanical, electromechanical or electronic connections with metal. Fluxes may be applied to the metal surface separately or as part of the solder paste. Several functions are achieved by flux application: the flux chemically and/or physically combines with undesirable "debris" on the metal surface, such as oxides and sulfides, and prevents oxide formation during the solder heating process. It also aids in reducing surface tension of the molten solder. After soldering is complete, however, the flux residues must be removed, since they may be corrosive, or interfere with the normal functioning of the apparatus to which they have been applied. The removal of these compounds is frequently not a routine matter, and usually cannot be achieved by a simple water wash. For example, in the fabrication of printed wiring boards and/or printed circuit boards, soldering fluxes are first applied to the substrate board material to ensure firm, uniform bonding of the solder. These soldering fluxes fall into two broad categories: rosin fluxes and non-rosin, or water soluble, fluxes. The rosin fluxes, which are generally less corrosive and have a much longer history of use, are still widely used throughout the electronics industry The water soluble fluxes, which are a more recent development, are being used increasingly in consumer products applications. Because they contain strong acids and/or amine hydrohalides and are thus corrosive, the water soluble soldering fluxes can cause circuit failure if residual traces of the material are not carefully removed. For that reason military specifications require the use of rosin fluxes. Even the use of rosin soldering fluxes, however, can lead to premature circuit failure due to decreased board resistance if traces of residual flux are not removed following soldering.

Fabrication of circuit boards is just one example of the use of fluxes. Other processes in which flux residues are produced, and in which removal is necessitated, include circuit board assembly, component packaging, and board clean-up after in-service maintenance. The joining of interconnect devices, e.g. computer connections with cables, also may require the use of solder and solder flux. More traditional uses of course include pipe-fitting, or any other procedure which requires the joining of metal surfaces. The most common flux used in both electronic and electromechanical joining are rosin fluxes, and in such uses, the removal of the flux is strongly preferred, if not absolutely necessary.

While water soluble fluxes can be easily removed with warm, soapy water, the removal of rosin flux from printed wiring boards has traditionally been carried out with the use of chlorinated hydrocarbon solvents such as 1,1,1,-trichloroethane, trichloromonofluoromethane, methylene chloride, trichlorotrifluoroethane, or mixtures or azeotropes of these solvents. These solvents are undesirable, however, because they are toxic or otherwise environmentally objectionable. Thus, their use is subject to close scrutiny by the Occupational Safety and Health Administration (OSHA) or other regulatory bodies, and stringent containment equipment must be used. Moreover, if released into the environment these solvents are not readily biodegradable and are thus hazardous for long periods of time.

Alkaline cleaning compounds known as the alkanol amines, usually in the form of monoethanolamine, have been used for rosin flux removal as an alternative to the toxic halogenated hydrocarbon solvents. These compounds chemically react with rosin flux to form a rosin soap through the process of saponification. Other organic substances such as surfactants or alcohol derivatives may be added to these alkaline cleaning compounds to facilitate the removal of such rosin soap. Unfortunately, these compounds, like the water soluble soldering fluxes, have a tendency to cause corrosion of the surfaces and interfaces of printed wiring boards if they are not completely and rapidly removed during the fabrication process.

In another approach, Bakos et al. (U.S. Pat. No. 4,276,186) have used mixtures of N-methyl-2-pyrrolidone and a water miscible alkanolamine to remove solder flux and solder flux residue from integrated circuit modules. These mixtures were also said to be useful for removing various cured synthetic organic polymer compositions such as cured polyimide coating compositions from integrated circuit chip modules.

Another alternative to the use of halogenated hydrocarbons has also been described in U.S. Pat. No. 4,640,719 to Hayes et al. Described therein is a method for cleaning circuit boards which employs terpenes as cleaning agents. Due to the above noted environmental conditions, there is an increasing commercial demand for highly effective circuit board cleaners having a variety of desirable characteristics, such as non-toxicity, high flash point and low environmental impact which enhance their usefulness under a variety of circumstances. The compositions of the present invention, comprising dibasic esters, provide the desired characteristics in their low toxicity relative to halogenated hydrocarbons, as well as having a relatively high flash point. Moreover, the present compositions do not have a harmful effect on the earth's stratospheric ozone layer; depletion of the ozone layer is another problem which is encountered with the use of halogenated hydrocarbons. Further, esters of the present invention generally have a relatively low vapor pressure, and are therefore less volatile, providing the advantage of lower volatile organic compound (VOC) pollutant emissions, than prior art compositions. These compositions are also useful in removing other difficult organic residues, such as printing inks and resists. Thus, the present method and compositions provide cleaning ability equivalent to those known in the art, while also providing advantageous characteristics which have not generally been found in most prior art methods and compositions.

3. SUMMARY OF THE INVENTION

It is an object of the present invention to provide compositions and methods for the safe and effective removal of organic residues from contaminated surfaces without otherwise adversely affecting the surfaces being cleaned.

This invention provides cleaning methods and compositions for the removal of solder fluxes, and is particularly useful for rosin flux removal, which cannot be achieved by water rinse. By use of the present method, the possibility of premature circuit failure that might occur on electronic circuit boards in the absence of such cleaning is eliminated or greatly reduced. The compositions can also be used to clean other surfaces in which solder is used, in conjunction with flux, to form metal-to-metal contacts.

Additionally, the compositions can be effectively employed in the removal of uncured or partially cured printing inks from screens and stencils, as well as uncured resists used in etching, plating or soldering, from soldermasks and photomasks. As used in the present specification and claims, the phrase "printing inks" is intended to encompass thermally curable inks (e.g., one- or two-part epoxy inks) and U-V curable inks (e.g., acrylate-based inks). The term "resist" is intended to encompass alkaline soluble and other thermally curable resists, and UV curable resists.

The compositions used in the present method of the invention are characterized by low toxicity, biodegradability and non-corrosiveness, unlike the halogenated hydrocarbon solvents and alkaline screen cleaners that have heretofore been employed for solder flux and ink removal. These compositions also have a relatively high flash point, providing greater safety when used under conditions of high temperature, as well as in transportation. As a result, the need for costly containment equipment is eliminated.

More particularly, the present invention utilizes compositions comprising dibasic ester compounds, including aliphatic dibasic acid esters, such as dimethyl succinate, dimethyl adipate, or dimethyl glutarate, or aromatic dibasic acid esters such as diethyl phthalate, or mixtures of any of these. These compounds which have the ability to dissolve or otherwise remove rosin solder fluxes, oil, waxes, greasy substances, printing inks and resists could be used as such and removed, e.g., with clean absorbent materials. Preferably, however, the dibasic ester compounds of the present invention are combined with appropriate emulsifying surfactants to facilitate removal by water.

4. BRIEF DESCRIPTION OF THE FIGURE

One embodiment of the present invention may be more readily understood by reference to FIG. 1, wherein a flow chart shows a representative printed circuit/wiring board fabrication process.

5. DETAILED DESCRIPTION OF THE INVENTION

The compositions of the present invention contain aliphatic or aromatic dibasic acid ester compounds that have the ability to dissolve soldering flux, particularly rosin flux that is commonly used in the fabrication, assembly and maintenance of printed circuits or wiring boards. In addition, these compositions are also useful in cleaning surfaces which have been exposed to printing inks and resists. The compounds of the invention have the formula:

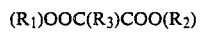

$(R_1)OOC(R_3)COO(R_2)$ wherein $R_1$ and $R_2$ are $C_1$–$C_6$ alkyl, and may be the same or different, and $R_3$ is —$(CH_2)_n$—, wherein n is an integer from 2–8, or a $C_6$–$C_{10}$ aromatic ring.

Although longer chain compounds may be as effective as shorter chain components, they are also more viscous; therefore, for convenience purposes, the preferred compounds of the present invention are those of the above formula in which n=2, 3, or 4. Particularly preferred in the present compositions are the compounds dimethyl succinate, dimethyl adipate and dimethyl glutarate, or any combination thereof. A particularly useful combination is available from E. I. DuPont (Wilmington, Del.) under the name DBE, and consists of a mixture by weight of about 15–25% dimethyl succinate, about 55–75% dimethyl glutarate, and about 10–25% dimethyl adipate. Other dibasic ester products, also available from DuPont, containing one or more of the aforementioned esters in different proportions, are DBE-2, DBE-3, DBE-4, DBE-5 and DBE-9. Alternately, dibasic esters are easily synthesized by methods well known in the art.

The compositions of this invention are characterized by low toxicity and environmental biodegradability, unlike the halogenated hydrocarbon solvents that had been used prior to this invention for printed wiring board cleaning.

The useful compounds of the present invention are insoluble, or very slightly soluble in water, and are also slightly viscous. The dibasic esters may be used alone to clean a contaminated surface, but are relatively difficult to flush off a surface with water. Therefore, in practice, the preferred compositions contain an emulsifying surfactant in combination with the dibasic esters. A thoroughly cleaned circuit board, from which substantially all traces of the cleaner are also removed, is necessary to meet the stringent military specifications for, such as the MilP28809A standard, for low conductivity after cleaning. Similarly, screens, masks and stencils which have been cleaned to remove inks or resists frequently are degraded by the types of solvents that are currently in use for this purpose; therefore, use of a noncorrosive cleaner, as well as thorough removal, can extend the useful life of these products.

Among those emulsifying surfactants which are useful for the present purposes are nonionic, anionic, cationic or amphoteric surfactants, and preferably nonionic surfactants such as condensation products of alkylene oxides, for example ethylene oxide, with any of a variety of hydrophobic moieties, as are well known in the art. Examples of these products are ethoxylated aliphatic alcohols, ethoxylated alkylphenols, ethoxylated amines, amides, and the like. Sulfated, sulfonated, phosphated and carboxylated hydrophobes, such as alcohols, can also be used, as can the salts of each. Particularly preferred as surfactants are ethoxylated aliphatic alcohols and their derivatives. The combination of the dibasic esters with these surfactants facilitates the removal of the cleaning composition from the printed wiring board by simple flushing with water. The quantity of the combined emulsifying agent in the present composition will vary, depending on the particular ester or combination of esters used. Generally, the added emulsifying agent will range, on a weight basis, from about 0–40% of the composition. In a preferred embodiment, the composition comprises a mixture of dimethyl adipate, dimethyl succinate, and dimethyl glutarate in a total amount of about 90–100%, and an ethoxylated aliphatic alcohol, in an amount of about 0–10%.

The compositions of the present invention are characterized by low toxicity and environmental biodegradability, unlike the halogenated hydrocarbon solvents that have been used prior to this invention for printed wiring board cleaning. The dibasic esters of the invention also provide the desirable characteristic of a high flash point. In addition to their rather low toxicity, biodegradability, and cleaning effectiveness, the present dibasic esters also have a much higher flash point than many currently available compounds, providing an added element of safety to the use of the present compositions, as well as relatively low vapor pressures. Any compound having a vapor pressure below 0.1 torr is considered by most states to be a non-volatile organic compound, and thus not subject to stringent regulation. Certain of the dibasic esters have vapor pressures as low as 0.06 torr.

In another embodiment of the invention, both terpenes and dibasic esters are combined to provide an effective cleaning composition. The terpene compositions are quite effective cleaners, the flash point of which can be readily increased, by the addition of a dibasic ester. Terpene compounds useful for this purpose are described in U.S. Pat. No. 4,640,719, the teachings of which are incorporated herein by reference. As used in the present specification and in the claims, the term "terpene" is intended to be understood as one terpene, or more than one terpene; when a specific terpene compound is referred to, both the pure compound, as well as mixtures in which the named compound predominates, are encompassed. Preferred terpenes are limonene and dipentene. Enhancement of cleaning effectiveness may also be achieved by the combination of esters and terpenes.

The relative proportions of the combination will vary depending upon the temperature at which the work is to be conducted. For example, at temperatures of about 140° F., a combination containing about 80% dibasic ester, and up to about 20% terpene will provide both the effectiveness and safety factor desired. Adjustment of the ratios in accordance with the preferred temperature is a routine modification well within the ability of one skilled in the art, as is the selection of an appropriate emulsifying surfactant, should such be desired.

The utility of the compositions of the invention in various aspects of the printed circuit/wiring board fabrication process can best be understood by reference to a representative process flow chart, which is shown in FIG. 1.

The assembly manufacturing process involves the placement of components such as integrated circuits, resistors, capacitors, diodes, etc. on the surface of the board or their insertion through pre-drilled holes. The components are then secured by soldering by manual or automatic means. Interspersed with the soldering operations are cleaning procedures and inspections to ensure that contaminants such as solder flux residues that could lead to premature circuit failure do not remain. Certain points in the fabrication process to which the compositions of the invention apply will be identified below.

In a second embodiment, the compositions are useful in cleaning various surfaces which are utilized in electronic printing of circuit boards, particularly screen process printing and photomechanical methods. The screen or stencil process involves the application of a stencil, which represents the non-printing areas, to a silk, nylon, stainless steel, polyester, or metallized polyester fine mesh screen, to which ink is applied and transferred to the surface to be printed. The stencils and screens used in this process accumulate a substantial amount of ink which must be periodically removed. The photomechanical processes rely on exposure of photooptic images on light-sensitive coatings that, on exposure to light, undergo changes in physical characteristics so that they can be developed to produce images that serve either as printing images or as resists for printing images. When the hardened coatings are used as resists, for example, in deep etch or metal plates, they must subsequently be removed after the images have been produced. There are many compositions which are currently used for removal of such compounds, such as xylene, toluene, acetone, methyl ethyl ketone, lacquer thinner, N-methyl pyrrolidone (NMP), chlorinated solvents, or caustic solutions. However, materials such as halogenated or caustic compounds present substantial safety concerns. Some of these materials, such as NMP, are not readily biodegradable, and also chelate metals, so that contaminating metals are also washed into the waste water with which the solvents are removed. Additionally, certain of these materials also attack the screens or stencils they are used to clean, and are therefore only marginally acceptable for cleaning purposes. The present method, utilizing dibasic esters, avoids the environmental problems, while providing an equivalent or better level of cleaning of these organic contaminants.

1. ROSIN FLUX CLEANING AND RESIDUE REMOVAL

For the removal of rosin soldering flux deposits during printed circuit/wiring board fabrication, the compositions of the invention may be applied to the boards by immersion in dip tanks or by hand or mechanical brushing. Alternatively, they may be applied by any of the commercially available printed wiring board cleaning equipment. Dishwasher size units may be employed, or much larger continuous belt cleaning machinery such as Total Systems Concept's Dual Process Cleaning System models 31-218, 31-418, 31-224 and 31-424 (Total Systems Concept, St. Louis, Mo.). Depending upon their design, these washers may apply the compositions of the invention by spraying with mechanical nozzles or by rolling contact with wetted roller surfaces. The temperature at which the compositions may be applied can range from room, or ambient, temperature (about 70° F.) to about 150° F. A dibasic ester-emulsifier composition may be used full strength or, in certain applications, diluted with water to as low as about a 2 volume percent concentration. The compositions should contact the boards for about 1 to about 5 minutes.

The points at which the compositions of the invention would be applied for solder flux removal in a typical printed wiring board fabrication process are indicated in FIG. 1 by the term "post clean", referring to the post solder cleaning process.

Once the flux has been loosened and solubilized during a period of contact which typically ranges from about 1 to about 5 minutes, the compositions of the invention are removed. Removal of the compositions can be carried out by flushing with a non-toxic, miscible solvent or by absorption into appropriate materials. In the preferred embodiments of the invention, which contain dibasic ester emulsifying surfactants, the boards may simply be flushed with water for a period of up to about 2 minutes. Deionized water is preferred. In the absence of an emulsifying surfactant in a composition, a suitable solvent, such as an alcohol, could be used for flushing. The optimal rinsing time varies according to the kinds of surfactants and their concentrations in the ester formulations used and can easily be determined by routine experimentation.

The cleaned boards are then dried, preferably with forced air. Drying is expedited if the air is warmed, preferably to above about 100° F. Variations of the foregoing method for use with removal of flux from other surfaces, such as pipe joints, will be readily apparent to one skilled in the art.

5.2. SCREEN INK CLEANING AND RESIDUE REMOVAL

In removing ink or resists from screens, excess ink is usually scraped from the screen by hand. The screen may be optionally washed in the DBE screen wash product to loosen any partially cured material. The screen wash product is then high pressure-sprayed (e.g., 50–80 psi) onto the entire screen, and allowed to stand for 30 to 60 seconds. The screen is then reversed, and high pressure sprayed again over its entire area, and let stand for 30 to 60 seconds. The screen is then rinsed in a high pressure water rinse for a short time (e.g., 60–120 seconds). If the screens have not been presoaked, and partially cured screen inks remain, this step may be repeated. The stencil or image is then ready for removal; the stencil is removed chemically, usually with sodium periodate, which is hand-applied to the screen. Finally, a high pressure spray water rinse is applied and the screens air dried or air-blow dry.

6. EXAMPLES

6.1. ROSIN FLUX CLEANING

To test the cleaning ability of the present dibasic ester containing compositions, a dibasic ester composition was prepared as follows:

| DuPont DBE ™ solvent | 90.0% |
| Shell Neodol ™ 91-6 | 5.0% |
| Shell Neodol ™ 25-9 | 5.0% |

A test coupon was cut out of the center of a large, unpopulated circuit board. The board substrate chosen was ordinary laminate and already had its circuit tracings and through-holes tin-plated. The coupon was rectangular and about 3.5×6.5 inches. The board was coated with Alpha 711 flux (Alpha Metals, Inc., Jersey City, N.J.), an RA type flux with about 57% solids. The board was then allowed to air dry for about 15 minutes.

In an attempt to mimic the "burning" effect which occurs to the flux during the soldering operation, the board was baked in an oven for 2 hours at 155° C. The boards were then allowed to cool, and then weighed on a 3-place toploading balance.

About 600 ml of the cleaning formulation was placed in the bottom of 9×13 inch stainless steel baking pans. The formulation was heated to 110° F. on a hotplate. The board to be cleaned was laid flat in the bottom of the pan, which was then agitated gently by rocking it slowly back and forth. After one minute of rocking, the board was turned over to permit the other side to have equal contact with the cleaner. The cleaning process proceeded for a total of about 2 minutes.

The board was removed from the tray and immediately rinsed under cold flowing tap water. The board was rinsed briefly with deionized water, and oven dried at 60° C. for 15 minutes. The board was then weighed again to determine the amount of flux removed by the cleaning process.

The board was then cleaned in an ultrasonic bath with methylene chloride to remove all traces of residual flux. The board was rinsed with deionized water, oven dried, and reweighed to determine the amount of flux residue left on the board. The results of this test are presented in Table I.

TABLE I

|  | (DBE) |
|---|---|
| Tare (g) | 52.386 |
| Flux coated (g) | 53.418 |
| Cleaned (g) | 52.576 |
| MeCl$_2$ extracted (g) | 52.383 |
| Flux wt. after baking | 1.032 |
| Wt. of flux removed by cleaning | 0.842 |
| Flux remaining after cleaning | 0.190 |
| % flux removed | 81.6% |
| % flux remaining | 18.4% |

(b) A similar test was undertaken with a small, 3¼" square, populated board to determine if the dibasic ester composition could effectively clean under small spaces. THe procedure for the test is identical to the one described in (a), with the exception that the board was baked for 17 hours at 120° C. to harden the flux. The results of this test are shown in Table II.

TABLE II

| Populated Board Cleaned with DBE | |
|---|---|
| Flux coated (g) | 25.868 |
| Cleaned (g) | 25.213 |
| MeCl$_2$ extracted (g) | 25.147 |
| Flux wt. after baking | 0.721 |
| Wt. of flux removed by cleaning | 0.655 |
| Flux remaining after cleaning | 0.066 |
| % flux removed | 90.8% |
| % flux remaining | 9.2% |

The foregoing results plainly demonstrate that the cleaning compositions of the present invention are extremely effective in removing flux and cleaning printed circuit boards.

6.2. SCREEN INK CLEANING

Two screens used to apply Hysol SR 1000 (Hysol Electronic Chemicals Division, Industry, Calif.) ink were cleaned, one with a commercial screen cleaner product, comprising a mixture of NMP and surfactants (85% NMP, 15% surfactants) and the other with a dibasic ester-surfactant mixture, Bioact®EC-8, comprising 90% DBE (DuPont) and 10% Tergitol NP-10 (Union Carbide). The respective cleaners were left on the screen for about 5 minutes, then both were water rinsed. Both products removed ink with approximately equal efficiency; however, a visual and physical examination showed that the DBE composition did not attack the screen material, whereas NMP did attack the screen.

Many modifications and variations of this invention may be made without departing from its spirit and scope, as will become apparent to those skilled in the art. The specific embodiments described herein are offered by way of example only, and the invention is limited only to the terms of the appended claims.

What is claimed is:

1. A method for removing rosin solder flux or resist residues from a contaminated surface, comprising
   (a) contacting the surface with a composition comprising at least one dibasic acid ester and from 0 to about 40% by weight of an appropriate emulsifying surfactant;
   allowing the contact to continue for sufficient time to solubilize the residue; and
   (c) removing,/the composition and solubilized residue from the surface.

2. A method of claim 1 wherein the surfactant is a condensation product of an alkylene oxide and a hydrophobic moiety.

3. The method of claim 1 wherein the surfactant is selected from the group consisting of ethoxylated aliphatic alcohols; ethoxylated alkyl phenols; ethoxylated amines; amides; and sulfated, sulfonated, phosphated, and carboxylated hydrophobes, and salts thereof.

4. The method of claim 1 wherein the ester is an aliphatic dibasic acid ester.

5. The method of claim 1 wherein the ester is an aromatic dibasic acid ester.

6. The method of claim 5 wherein the ester group consisting of dibasic compound is selected from the esters of adipic acid, succinic acid and glutaric acid.

7. The method of claim 6 wherein the ester compound is selected from the group consisting of dimethyl adipate, dimethyl succinate and dimethyl glutarate.

8. The method of claim 6 wherein the composition comprises a mixture of more than one compound selected from the group consisting of dimethyl adipate, dimethyl succinate and dimethyl glutarate.

9. The method of claim 5 wherein the ester is diethyl phthalate.

10. The method of claim 2 wherein the surfactant comprises by weight of the composition about 0 to 10%.

11. The method of claim 1 or 2 or 3 or 4 or 5 or 6 or 7 or 8 or 9 or 10 wherein the composition also comprises a terpene.

12. The method of claim 11 wherein the terpene is limonene or dipentene.

13. The method of claim 1 or 2 or 3 or 4 or 5 or 6 or 7 or 8 or 9 wherein the contact is carried out at a temperature of from about room temperature to about 150° F.

14. The method of claim 11 wherein the contact is carried out at a temperature of from about room temperature to about 150° F.

15. The method of claim 12 wherein the contact is carried out at a temperature of from about room temperature to about 150° F.

16. The method of claim 1 wherein the compound comprises a mixture of dimethyl adipate, dimethyl succinate, and dimethyl glutarate, with an ethoxylated aliphatic alcohol as surfactant.

17. The method of claim 1 or 2 or 3 or 4 or 5 or 6 or 7 or 8 or 9 or 10 wherein the residue is rosin solder flux.

18. The method of claim 17 wherein the surface is a printed circuit board.

19. The method of claim 11 wherein the residue is rosin solder flux.

20. The method of claim 19 wherein the surface is a printed circuit board.

21. The method of claim 12 or 14 or 16 wherein the residue is rosin solder flux.

22. The method of claim 12 or 14 wherein the surface is a printed circuit board.

23. The method of claim 1 or 2 or 3 or 4 or 5 or 6 or 7 or 8 or 9 or 10 wherein the residue is a resist.

24. The method of claim 11 wherein the residue is a resist.

25. The method of claim 12 wherein the residue is a resist.

26. The method of claim 14 wherein the residue is rosin solder flux.

27. The method of claim 16 wherein the residue is rosin solder flux.

28. The method of claim 14 wherein the surface is a printed circuit board.

29. The method of claim 16 wherein the surface is a printed circuit board.

30. The method of claim 14 wherein the residue is a resist.

31. The method of claim 16 wherein the residue is a resist.

* * * * *

UNITED STATES PATENT AND TRADEMARK OFFICE
CERTIFICATE OF CORRECTION

PATENT NO.   : 4,934,391

DATED        : June 19, 1990

INVENTOR(S)  : Larry Futch; Kevin R. Hrebenar and Michael E. Hayes

It is certified that error appears in the above-identified patent and that said Letters Patent is hereby corrected as shown below:

On the title page, Following the Inventors, "Hayes, Hayes" should read --Hayes, Fernandina Beach--.

On Column 10, line 34, "claim 12 or 14 or 16" should read --claim 12--.

On Column 10, line 36, "claim 12 or 14" should read --claim 12--.

Signed and Sealed this

Twenty-fourth Day of September, 1991

Attest:

HARRY F. MANBECK, JR.

Attesting Officer

Commissioner of Patents and Trademarks